United States Patent
Kwak

(10) Patent No.: US 9,553,168 B2
(45) Date of Patent: Jan. 24, 2017

(54) SEMICONDUCTOR MEMORY DEVICE AND METHOD OF MANUFACTURING THE SAME

(71) Applicant: SK hynix Inc., Gyeonggi-do (KR)

(72) Inventor: Sang Hyon Kwak, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 13 days.

(21) Appl. No.: 14/536,276

(22) Filed: Nov. 7, 2014

(65) Prior Publication Data

US 2015/0064866 A1 Mar. 5, 2015

Related U.S. Application Data

(62) Division of application No. 13/830,912, filed on Mar. 14, 2013.

(30) Foreign Application Priority Data

Nov. 30, 2012 (KR) .................. 10-2012-0137804

(51) Int. Cl.
| | | |
|---|---|---|
| H01L 29/66 | (2006.01) | |
| H01L 27/115 | (2006.01) | |
| H01L 21/285 | (2006.01) | |
| H01L 29/78 | (2006.01) | |

(52) U.S. Cl.
CPC ... H01L 29/66666 (2013.01); H01L 21/28512 (2013.01); H01L 27/11556 (2013.01); H01L 27/11582 (2013.01); H01L 29/7827 (2013.01)

(58) Field of Classification Search
CPC .............. H01L 27/11582; H01L 27/11556; H01L 27/11551; H01L 29/7926; H01L 29/66666; H01L 29/7827; H01L 27/11578; H01L 29/78642; H01L 29/7802; H01L 27/10876; H01L 29/66712

See application file for complete search history.

(56) References Cited

U.S. PATENT DOCUMENTS

| | | | | |
|---|---|---|---|---|
| 2006/0103286 A1* | 5/2006 | Lambertini | .............. | H01K 1/02 313/311 |
| 2008/0179746 A1* | 7/2008 | Hur | .................. | H01L 21/76838 257/751 |
| 2010/0181610 A1* | 7/2010 | Kim | .................... | H01L 29/7926 257/314 |
| 2011/0143529 A1* | 6/2011 | Lee | .................... | H01L 21/28185 438/591 |
| 2012/0094453 A1* | 4/2012 | Han | .................. | H01L 27/11582 438/269 |

* cited by examiner

Primary Examiner — Dale E Page
Assistant Examiner — John Bodnar
(74) Attorney, Agent, or Firm — IP & T Group LLP

(57) ABSTRACT

The present technology includes a semiconductor memory device, including a channel layer and interlayer insulation layers surrounding the channel layer. The interlayer insulation layers are stacked with a trench interposed therebetween. A seed pattern is formed on a surface of the trench and a metal layer is formed on the seed pattern in the trench.

8 Claims, 18 Drawing Sheets

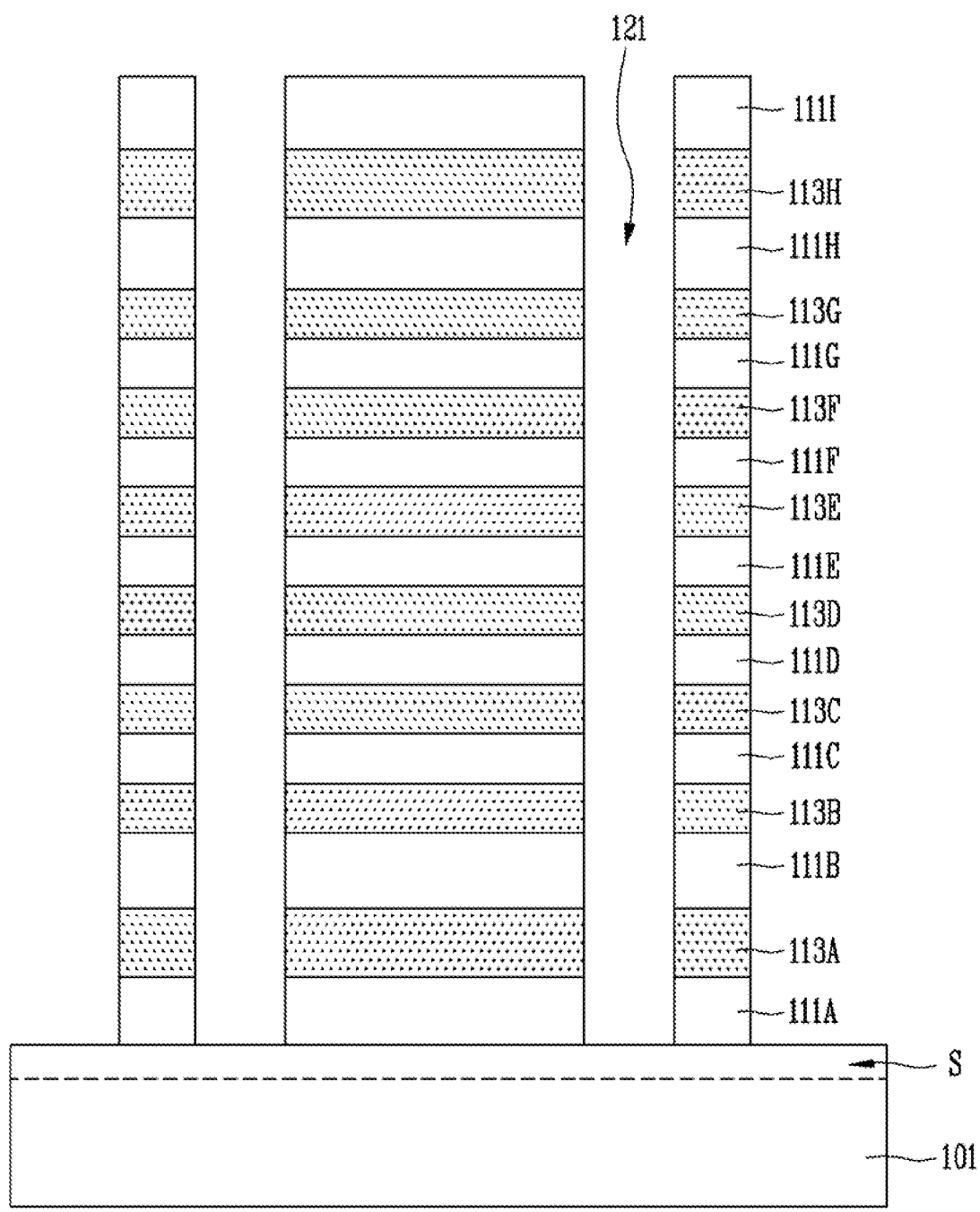

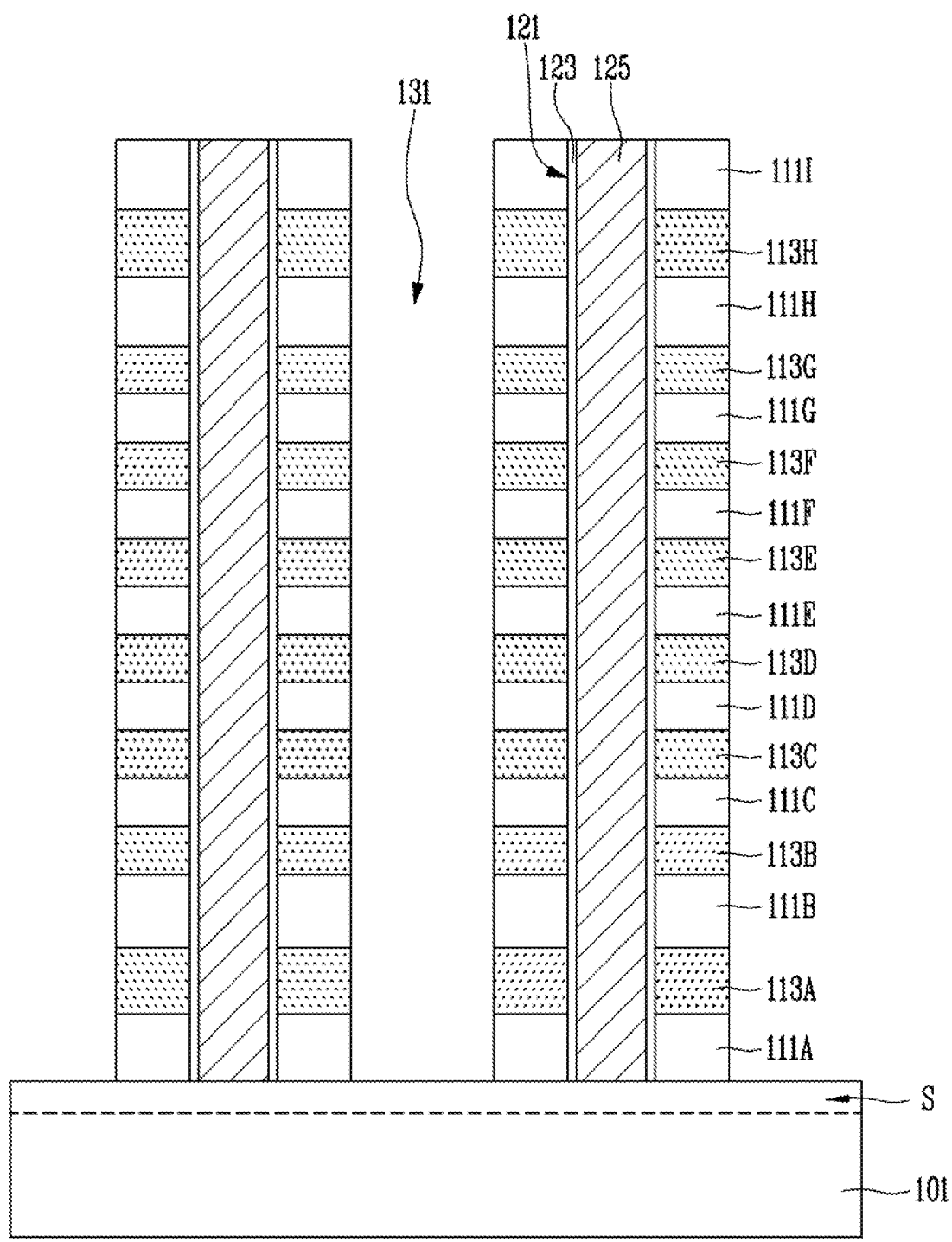

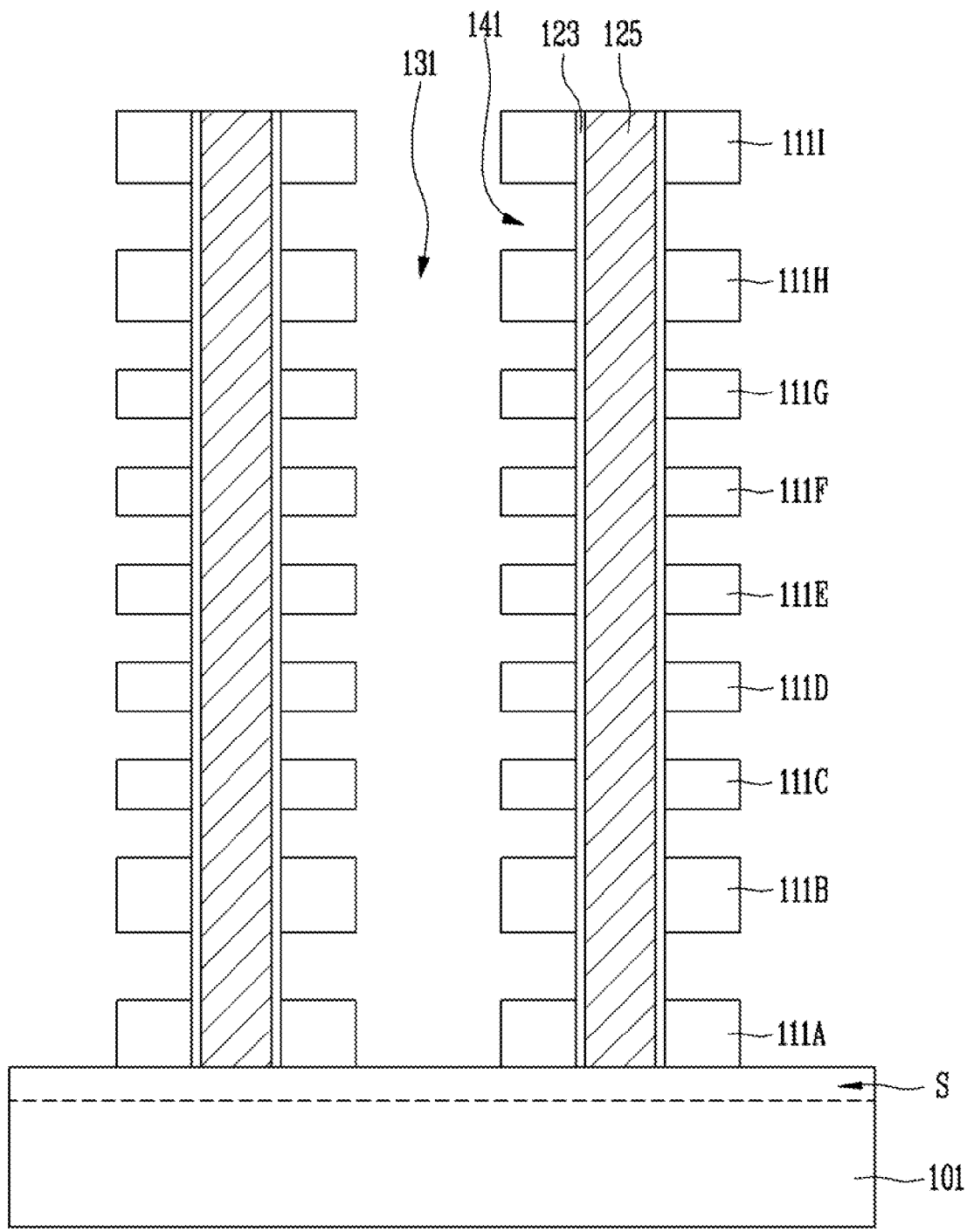

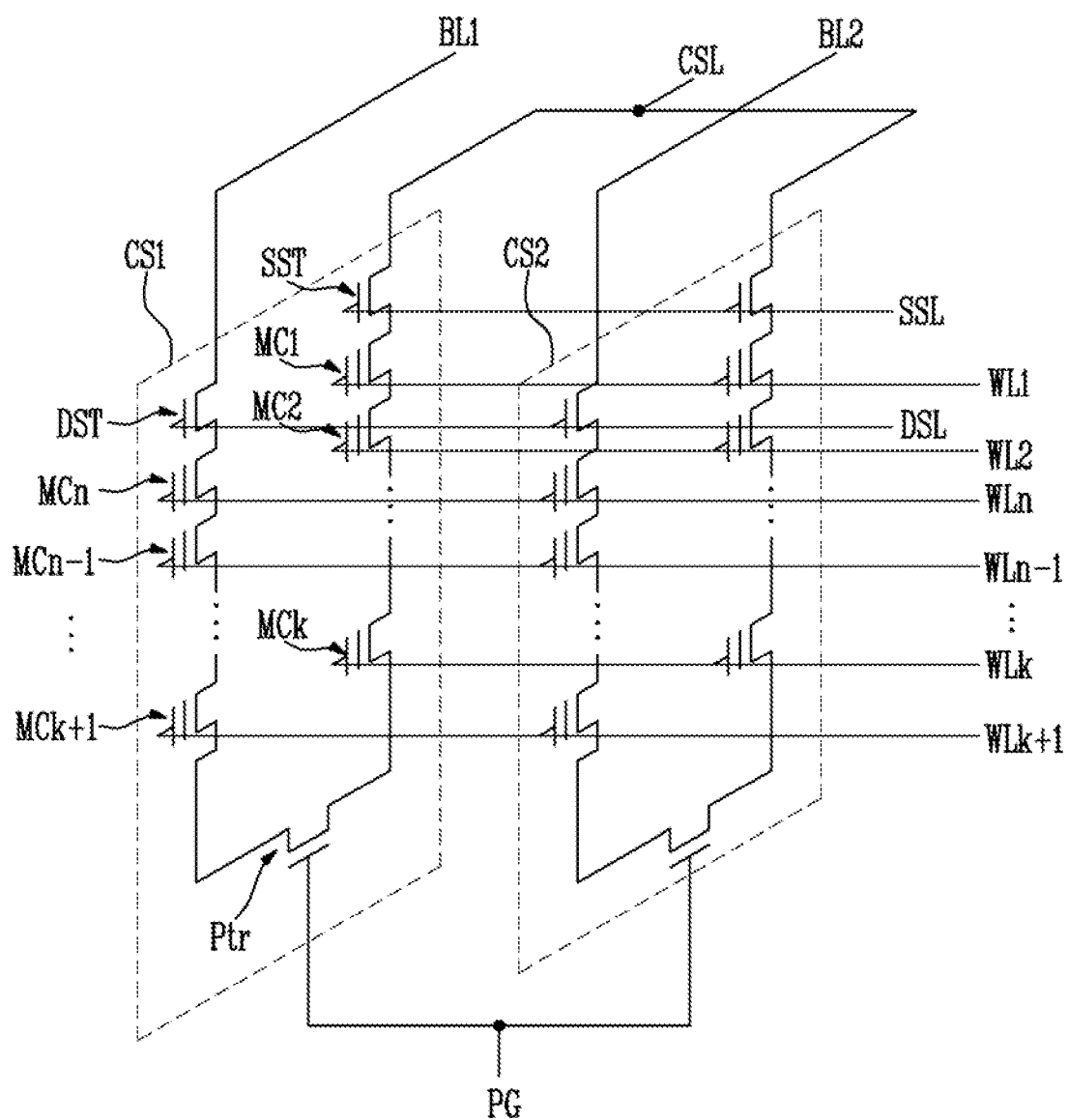

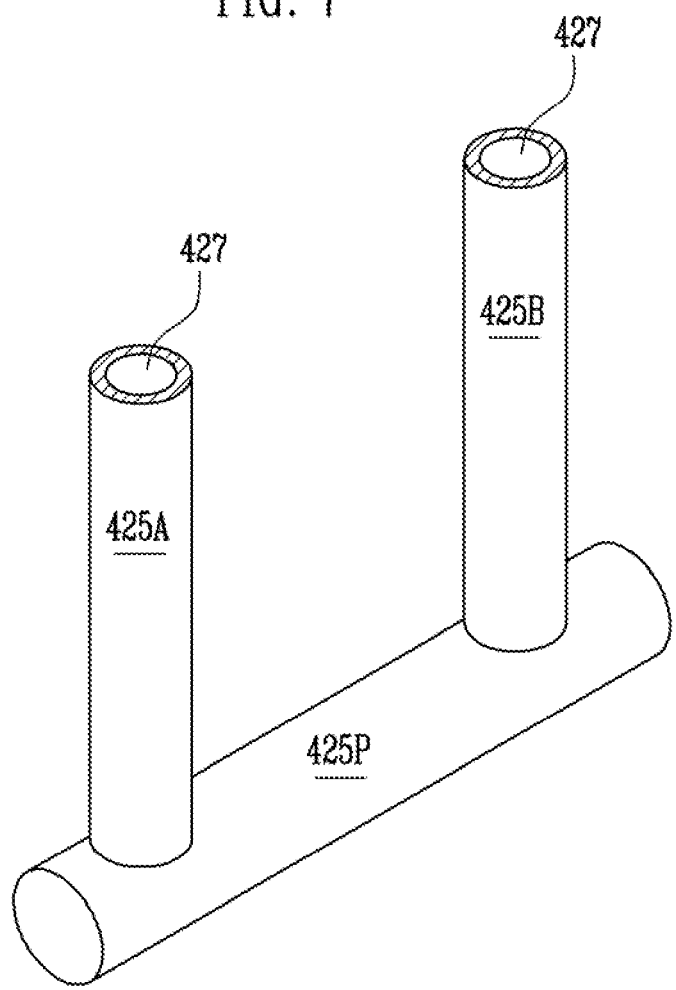

SEMICONDUCTOR MEMORY DEVICE AND METHOD OF MANUFACTURING THE SAME

CROSS-REFERENCE TO RELATED APPLICATION

This application is a division of U.S. patent application Ser. No. 13/830,912 filed on Mar. 14, 2013, which claims priority from Korean Patent Application No. 10-2012-0137804, filed on Nov. 30, 2012, with the Korean Intellectual Property Office. The disclosure of each of the foregoing application is incorporated herein in its entirety by reference.

BACKGROUND

1. Field

The present invention relates to a semiconductor memory device and a method of manufacturing the same, and more particularly, to a semiconductor memory device including alternately stacked insulation layers and conductive layers, and a method of manufacturing the semiconductor memory device.

2. Discussion of Related Art

Various technologies capable of improving a degree of integration have been developed in a field of a semiconductor memory device. A 3D semiconductor memory device in which memory cells are three-dimensionally arranged on a substrate has been suggested as one of the technologies suggested for improvement of a degree of integration.

FIGS. 1A to 1D are cross-sectional views for describing a method of manufacturing a 3D semiconductor memory device in the related art.

Referring to FIG. 1A, a plurality of first material layers 11A to 11E and a plurality of second material layers 13A to 13D are alternately stacked. Each of the plurality of first material layers 11A to 11E may be formed on a layer on which an interlayer insulation layer is to be formed, and may be formed of an insulation material for the interlayer insulation layer. Each of the plurality of second material layers 13A to 13D may be formed on a layer on which a conductive pattern (for example, a word line or a select line) is to be formed, and may be formed as a material layer having high etching selectivity for the first material layers 11A to 11E. The plurality of second material layers 13A to 13D may be formed as first sacrificial layers.

Next, channel holes 21 are formed by etching the plurality of first material layers 11A to 11E and the plurality of second material layers 13A to 13D. Then, a memory layer 23 may be formed on a sidewall of each of the channel holes 21. Subsequently, channel layers 25 are formed in the channel holes 21 in which the memory layers 23 are formed.

Then, a trench 31 is formed by etching the plurality of first material layers 11A to 11E and the plurality of second material layers 13A to 13D between the channel layers 25. The trench 31 is formed so as to enable the sidewalls of the plurality of second material layers 13A to 13D to be exposed.

Referring to FIG. 1B, the plurality of second material layers 13A to 13D is selectively removed by an etching process using the large etching selectivity between the first material layers 11A to 11E and the plurality of second material layers 13A to 13D. A recess 41 is formed in each of regions in which the plurality of second material layers 13A to 13D is removed.

Referring to FIG. 1C, a conductive layer 51 is formed so as to fill the recess 41. A void 53 may be formed in the recess 41 during a process of forming the conductive layer 51.

Referring to FIG. 1D, a part of the conductive layer 51 formed in the trench 31 is removed by an etching process so that the conductive layer 51 is left only in the recess 41. Accordingly, a conductive pattern 51P separated for each recess 41 is formed.

In FIG. 1C, the conductive layer 51 may not be formed in a uniform thickness during the aforementioned process of forming the conductive layer 51. Further, an etching thickness may be non-uniform for each region during a process of etching the conductive layer 51. Accordingly, the void 53 in the recess 41 may be opened during the process of etching the conductive layer 51. More severely, an etching material permeates through the void 53 so that the conductive layer 51 in the recess 41 is completely removed, and thus the conductive pattern 51P in the recess 41 may not be left. When the etching thickness of the conductive layer 51 is decreased in order to decrease loss of the conductive pattern 51P, a defect that the conductive layer 51 is not separated for each recess 41 may be generated.

Due to the aforementioned problems, a level of difficulty of manufacturing a structure in which insulation layers and conductive layers are alternately stacked is increased.

SUMMARY

The present invention has been made in an effort to provide a semiconductor memory device capable of improving a level of process difficulty, and a method of manufacturing the semiconductor memory device.

An exemplary semiconductor memory device includes a channel layer; interlayer insulation layers surrounding the channel layer, wherein the interlayer insulation layers are stacked with a recess interposed therebetween; a seed pattern formed on a surface of the recess; and a metal layer formed on the seed pattern in the recess.

An exemplary method of manufacturing a semiconductor memory device includes forming interlayer insulation layers surrounding a channel layer, wherein the interlayer insulation layers are stacked with a recess interposed therebetween; forming a seed film on a surface of the recess and on a surface of each of the interlayer insulation layers; forming a sacrificial pattern in the recess; forming a seed pattern in the recess by etching the seed film by using the sacrificial pattern as an etching barrier; and growing a metal layer from the seed pattern in the recess.

BRIEF DESCRIPTION OF THE DRAWINGS

The above and other features and advantages of the present invention will become more apparent to those of ordinary skill in the art by describing in detail embodiments thereof with reference to the attached drawings in which:

FIGS. 3A to 3G are cross-sectional views illustrating a method of manufacturing an exemplary semiconductor memory device;

FIG. 5 is a circuit diagram illustrating an exemplary semiconductor memory device;

FIG. 7 is a diagram illustrating a channel layer of an exemplary semiconductor memory device;

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Figure 1A:
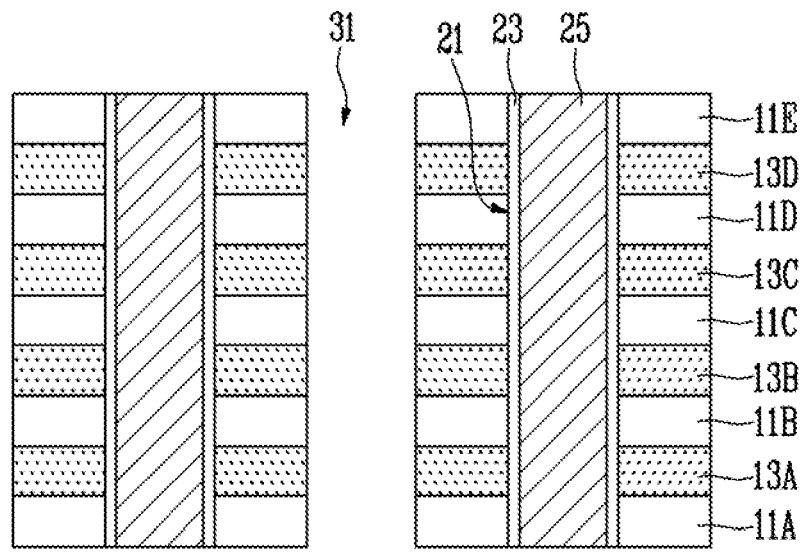
FIGS. 1A to 1D are cross-sectional views illustrating a method of manufacturing a related 3D semiconductor memory device.
Figure 1B:
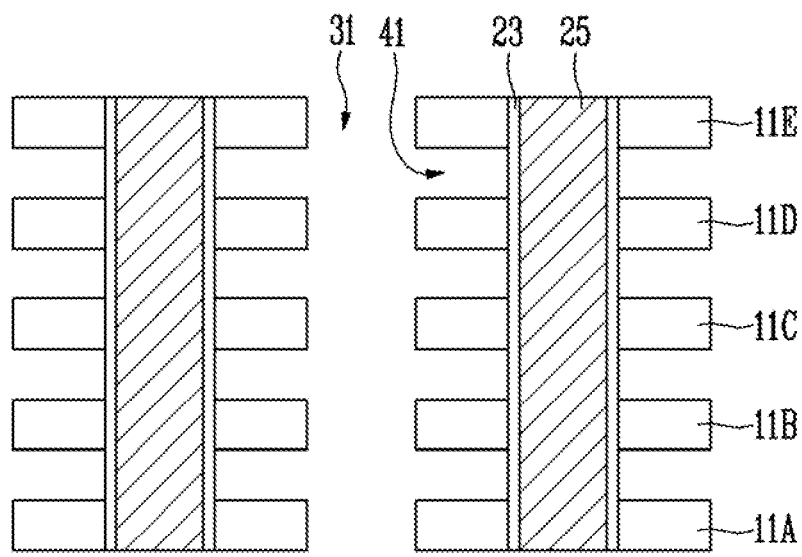
Figure 1C:
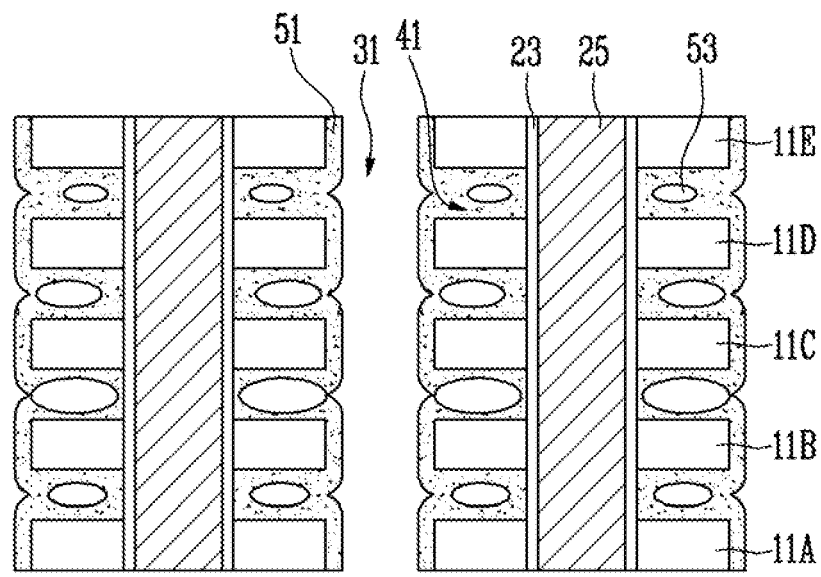
Figure 1D:
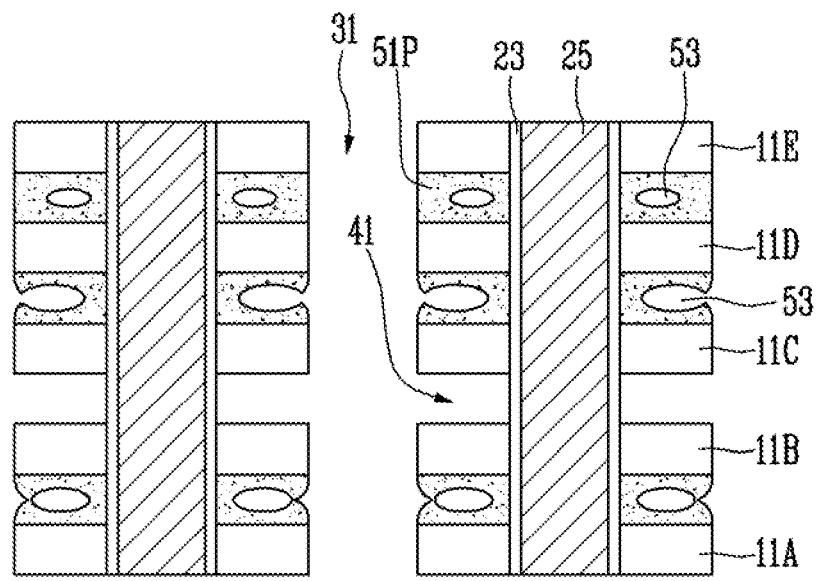
Figure 2:
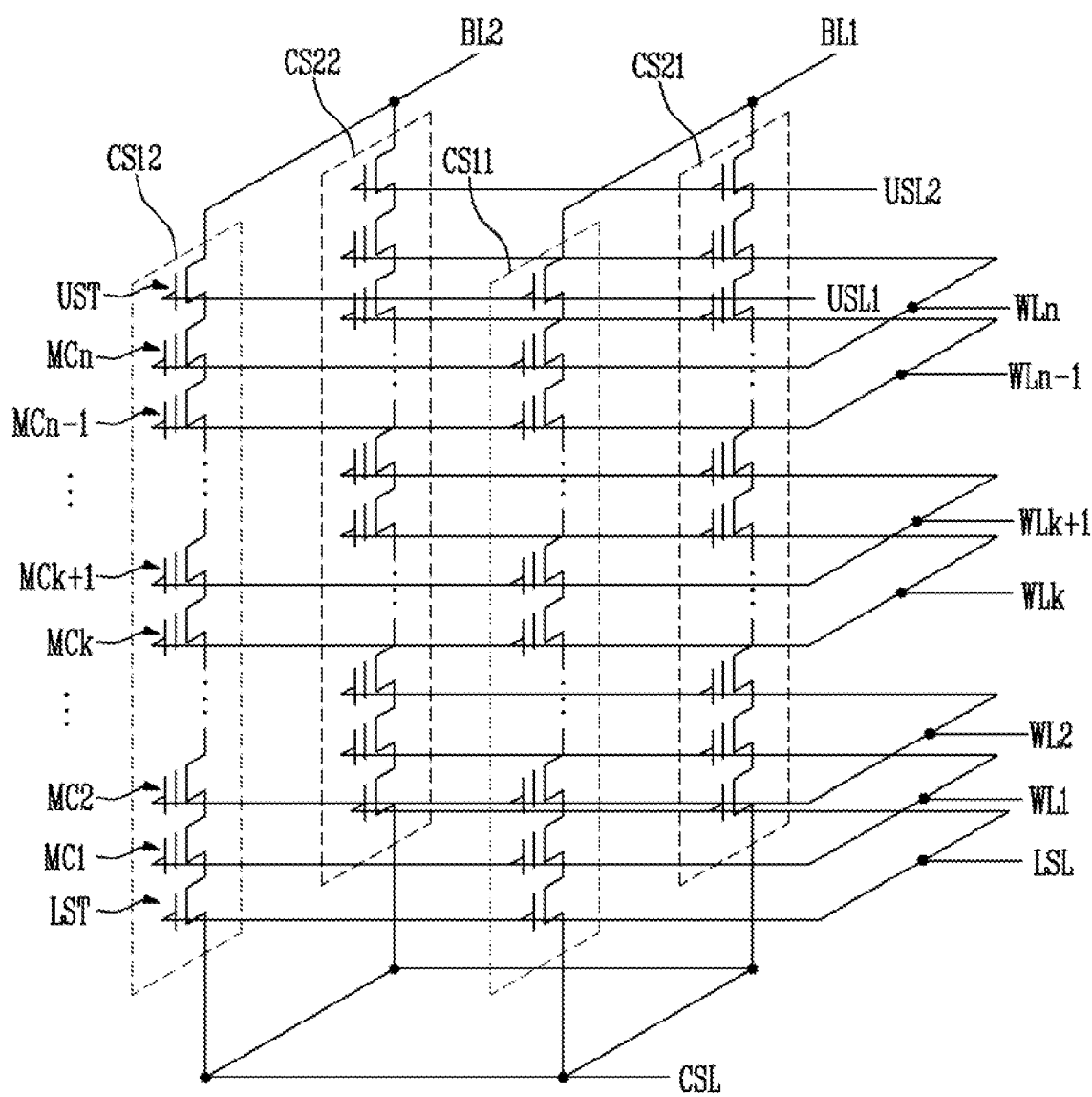
FIG. 2 is a circuit diagram illustrating an exemplary semiconductor memory device.

FIG. 2 is a circuit diagram illustrating a semiconductor memory device according to first and second embodiments of the present invention.

Referring to FIG. 2, an exemplary semiconductor memory device may include a common source line CSL, a plurality of bit lines BL1 and LB2, and a plurality of cell strings CS11, CS12, CS21, and CS22 connected between the common source line CSL and the bit lines BL1 and BL2.

The common source line CLS is commonly connected to source regions of the plurality of cell strings CS11, CS12, CS21, and CS22. The source region may be a doped poly silicon layer formed over a substrate, or a region formed by injecting an impurity in the substrate.

The bit lines BL1 and BL2 are conductive lines arranged over the plurality of cell strings CS11, CS12, CS21, and CS22. A series of cell strings arranged in an extension direction of each of the bit lines BL1 and BL2 is connected to each of the bit lines BL1 and BL2 in parallel.

Each of the plurality of cell strings CS11, CS12, CS21, and CS22 may include a first select transistor LST connected to the common source line CSL, a second select transistor UST connected to one of the plurality of bit lines BL1 and BL2, and a plurality of memory cell transistors MC1 to MCn stacked between the first select transistor LST and the second select transistor UST. The first select transistor LST, the plurality of memory cell transistors MC1 to MCn, and the second select transistor UST, included in each of the plurality of cell strings CS11, CS12, CS21, and CS22, are connected in series through a channel layer.

A gate of the first select transistor LST is connected to a first select line LSL, and a gate of the second select transistor UST is connected to a second select line USL1 or USL2. Gates of the plurality of memory cell transistors MC1 to MCn are connected to word lines WL1 to WLn. Gates of the plurality of first select transistors LST, arranged on the same layer, may be commonly connected to the first select line LSL. Gates of the plurality of second select transistors, arranged on the same layer in the same line, may be commonly connected to each of the second select lines USL1 or USL2. The gates of the memory cells arranged on the same layer may be commonly connected to each of the word lines WL1 to WLn. The first select line LSL, the word lines WL1 to WLn, and the second select lines USL1 or USL2 may be formed as metal layers stacked over the substrate. Conductive layers stacked over the substrate surround the channel layer.

Hereinafter, a method of manufacturing an exemplary semiconductor memory device will be described in more detail.

FIGS. 3A to 3G are cross-sectional views illustrating an exemplary method of manufacturing a semiconductor memory device.

Referring to FIG. 3A, first material layers 111A to 111I and second material layers 113A to 113H are alternately stacked over a semiconductor substrate 101. A source region S, in which an impurity is injected, may be formed in the semiconductor substrate 101. The source region S may be formed by forming a doped polysilicon layer on the semiconductor substrate 101 and the patterning the doped poly silicon layer.

The number of stacks of the first material layers 111A to 111I and the second material layers 113A to 113H may be variously changed according to the number of memory cells and the number of select transistors desired to be stacked over the semiconductor substrate 101. The first material layers 111A to 111I may be formed in levels where interlayer insulation layers are formed. The first material layers 111A to 111I may be formed of an insulation material configured as the interlayer insulation layer. The second material layers 113A to 113H may be formed in levels where a first select line, word lines, and a second select line are formed. The second material layers 113A to 113H may be formed of material layers having an etching selectivity that is greater than an etching selectivity of the first material layers 111A to 111I. For example, the first material layers 111A to 111I may use oxide layers for the interlayer insulation layers, and the second material layers 113A to 113H may use nitride layers for first sacrificial layers.

Next, channel holes 121, passing through the first material layers 111A to 111I and the second material layers 113A to 113H, are formed by etching the first material layers 111A to 111I and the second material layers 113A to 113H by a mask process. When the first material layers 111A to 111I and the second material layers 113A to 113H are formed of an insulation material, such as an oxide layer and a nitride layer, respectively, a degree of difficulty of the etching process may be reduced compared to a case where the first material layers 111A to 111I are formed of the insulation material and the second material layers 113A to 113H are formed of a conductive material.

Referring to FIG. 3B, a channel layer 125 is formed in the channel hole 121. The channel layer 125 may be formed by depositing a semiconductor layer, such as a silicon layer. The channel layer 125 may be formed so as to fill the channel hole 121 as illustrated in FIG. 3B.

Before the forming of the channel layer 125, a memory layer 123 may be formed along a sidewall of the channel hole 121. The memory layer 123 may include a charge blocking layer, a data storing layer, and a tunnel insulation layer. The charge blocking layer and the tunnel insulation layer may be an oxide layer, and the data storing layer may be a nitride layer in which a charge may be trapped. Otherwise, before the forming of the channel layer 125, the memory layer 123 may be partially formed. For example, the data storing layer and the tunnel insulation layer, except for the charge blocking layer may be formed, or the tunnel insulation layer, except for the charge blocking layer and the data storing layer, may be formed along the sidewall of the channel layer 125.

Next, a trench 131 is formed, via etching with a mask process, through the first material layers 111A to 111I and the second material layers 113A to 113H to expose the sidewalls of the second material layers 113A to 113H. The trench 131 may isolate the first material layers 111A to 111I and the second material layers 113A to 113H for each memory block or a line. A shape and a position of the trench 131 may be varied.

Referring to FIG. 3C, the second material layers 113A to 113H that are exposed through the trench 131 are removed by an etching process having a greater etching selectivity for the second material layers 113A to 113H than for the first material layers 111A to 111I. Accordingly, recesses 141 are formed in regions in which the second material layers 113A to 113H are removed.

Figure 3D:
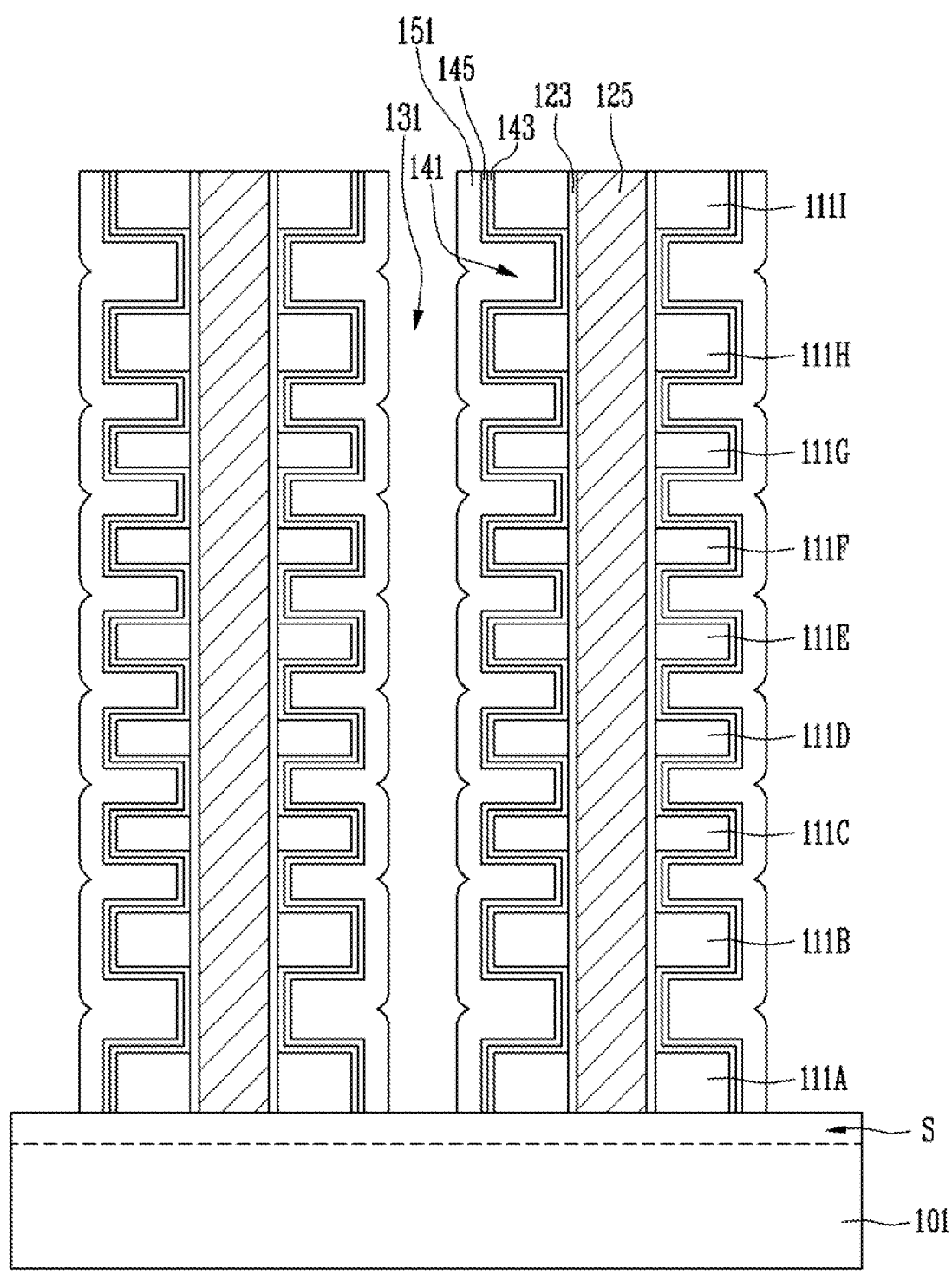

Referring to FIG. 3D, a barrier metal layer 143 may be further formed along surfaces of the recesses 141 and the sidewalls of the first material layers 111A to 111I. A seed film 145 is formed along surfaces of the recesses 141 and the sidewalls of the first material layers 111A to 111I exposed by the trench 131. The seed film 145 serves as a nucleus growing site for a metal layer to be formed in a subsequent process. The seed film 145 may be formed by supplying a reducing gas. For example, if the metal layer to be formed in a subsequent process is to be a tungsten layer, then the reducing gas may include at least one of monosilane ($SiH_4$), disilane ($Si_2H_6$), or dichlorosilane ($SiCl_2H_2$). If the reducing gas of the aforementioned example is supplied, a seed film 145 including silicon is formed. Silicon acts a nucleus growing site of tungsten in a subsequent process.

The barrier metal layer 143 may serve as a glue layer when the metal layer, such as tungsten, is formed, or may serve to prevent the permeation of fluorine (F) contained in tungsten hexafluoride ($WF_6$), if the metal layer is formed by using $WF_6$ gas. A titanium nitride layer may be used as the barrier metal layer 143. The titanium nitride layer may be formed by using titanium tetrachloride ($TiCl_4$) gas and ammonia ($NH_3$) gas. The barrier metal layer 143 may be formed by a chemical mechanical deposition method, which has an excellent step coverage characteristic to easily perform deposition within a uniform thickness.

A tungsten nitride layer WN may be formed as the seed film 145. The tungsten nitride layer WN may simultaneously perform a role as a nucleus growing site of tungsten and a role of the barrier metal in a subsequent process of forming the metal layer. Accordingly, when the WN is formed as the seed film 145, the barrier metal layer 145 may not be formed.

Although it is not illustrated, if the memory layer 123 is not formed along the sidewall of the channel hole 121, the memory layer 123 may be formed along the surfaces of the recesses 141 before the forming of the seed film 145 and the barrier metal layer 143. If a part of the memory layer 123 is formed along the sidewall of the channel hole 121, the remaining parts of the memory layer 123 may be formed along the surfaces of the recesses 141 before the forming of the seed film 145 and the barrier metal layer 143. For example, if the data storing layer and the charge blocking layer of the memory layer 123 are not formed along the sidewall of the channel hole 121, the data storing layer and the charge blocking layer may be formed along the surfaces of the recesses 141. Even though the memory layer 123 is formed along the sidewall of the channel hole 121, a separate charge blocking layer may be further formed along the surfaces of the recesses 141.

Then, a second sacrificial layer 151 is formed on the seed film 145. The second sacrificial layer 151 is formed of a material having an etching selectivity that is larger than an etching selectivity of the material of the seed film 145. The second sacrificial layer 151 may be formed of an insulation material.

Differently from the above-discussed embodiment, when the metal layer is deposited without forming the seed film 145 in the recess 141, surface roughness of the metal layer may be increased due to metal crystal. For this reason, it is difficult to obtain the metal layer having a uniform thickness. Further, a void is easily generated in the recesses 141, and a position of the void is non-uniform. When the metal layer is etched in a state where the position of the void is not uniform and the thickness of the metal layer is not uniform as described above, it is difficult to uniformly control a degree of etching.

The insulation material is easily deposited with a uniform thickness, compared to the metal layer. Accordingly, when the second sacrificial layer 151 is formed of an insulation layer in a state where the recesses 141 are opened, the second sacrificial layer 151 may be formed with a uniform thickness. As a result, it is easy to control a degree of etching when the etching process is performed so that the second sacrificial layer 151 is left only in the recesses 141 in a subsequent process. The second sacrificial layer 151 may be formed of a silicon oxide layer.

The second sacrificial layer 151 may be formed with a thickness sufficient to fill the recesses 141, and leave a center portion of the trench 131 open.

Figure 3E:
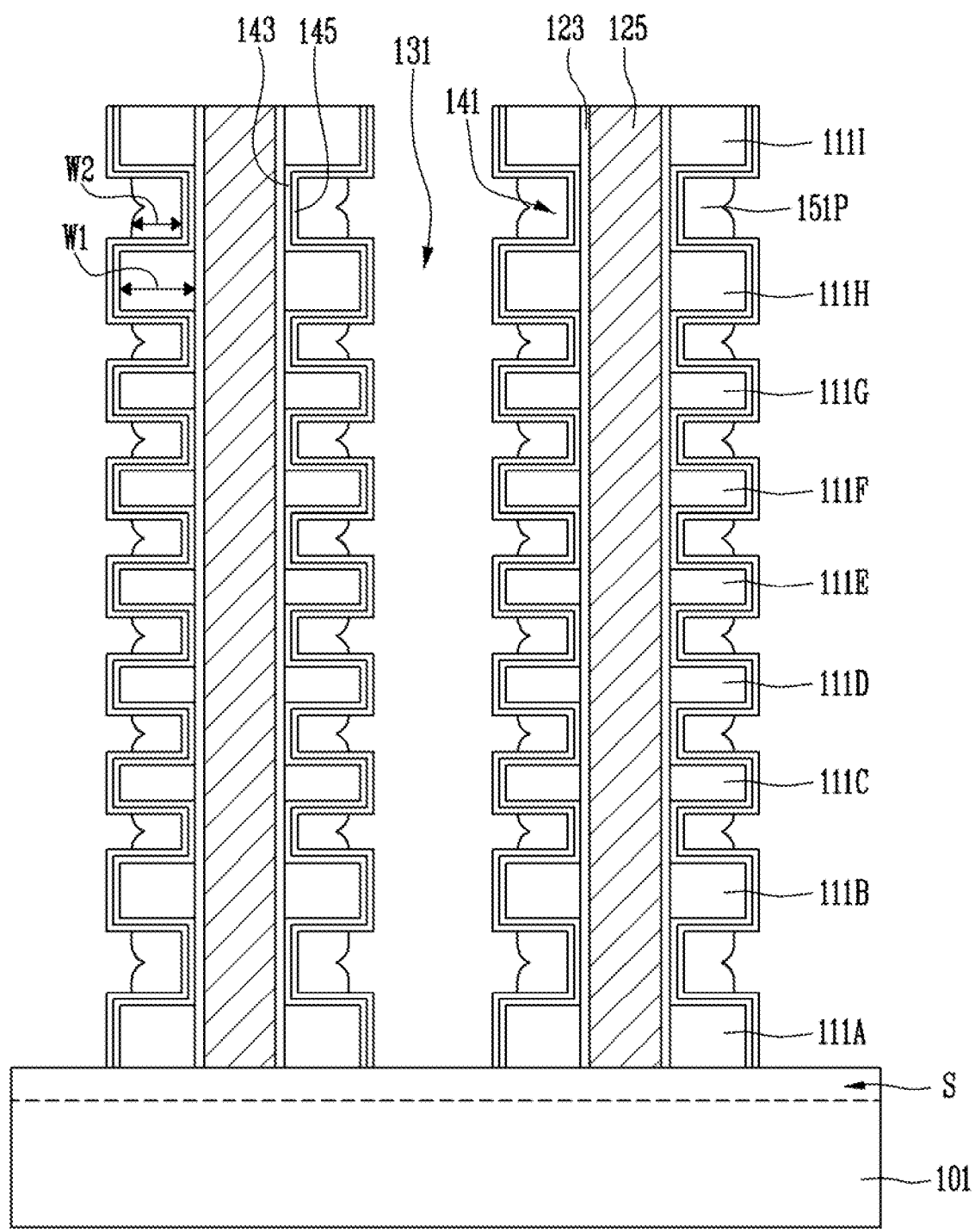

Referring to FIG. 3E, the second sacrificial layer 151 is selectively etched by an etching process having a greater etching selectivity for the second sacrificial layer 151 than for the seed film 145, so that the seed film 145 formed on the sidewalls of the first material layers 111A to 111I is exposed. The etching process is performed so that sacrificial patterns 151P are left in the recesses 141.

The process of etching the second sacrificial layer 151 may be performed by an isotropic dry or wet method. If the second sacrificial layer 151 that is a silicon oxide layer is etched by the isotropic dry method, the second sacrificial layer 151 may be etched by using etching gas including at least one of HF, $NH_3$, $NF_3$, and $CF_X$ (herein, x is a natural number). When the second sacrificial layer 151 that is a silicon oxide layer is etched by the isotropic wet method, the second sacrificial layer 151 may be etched by using hydrofluoric acid or buffer oxide etchant (BOE). In the etching process, a width W2 of the sacrificial patterns 151P from the sidewall of the channel layer 125 may be formed, by controlling an etching degree of the second sacrificial layer 151, to be smaller than a width W1 of the first material layers 111A to 111I from the sidewall of the channel layer 125.

Figure 3F:
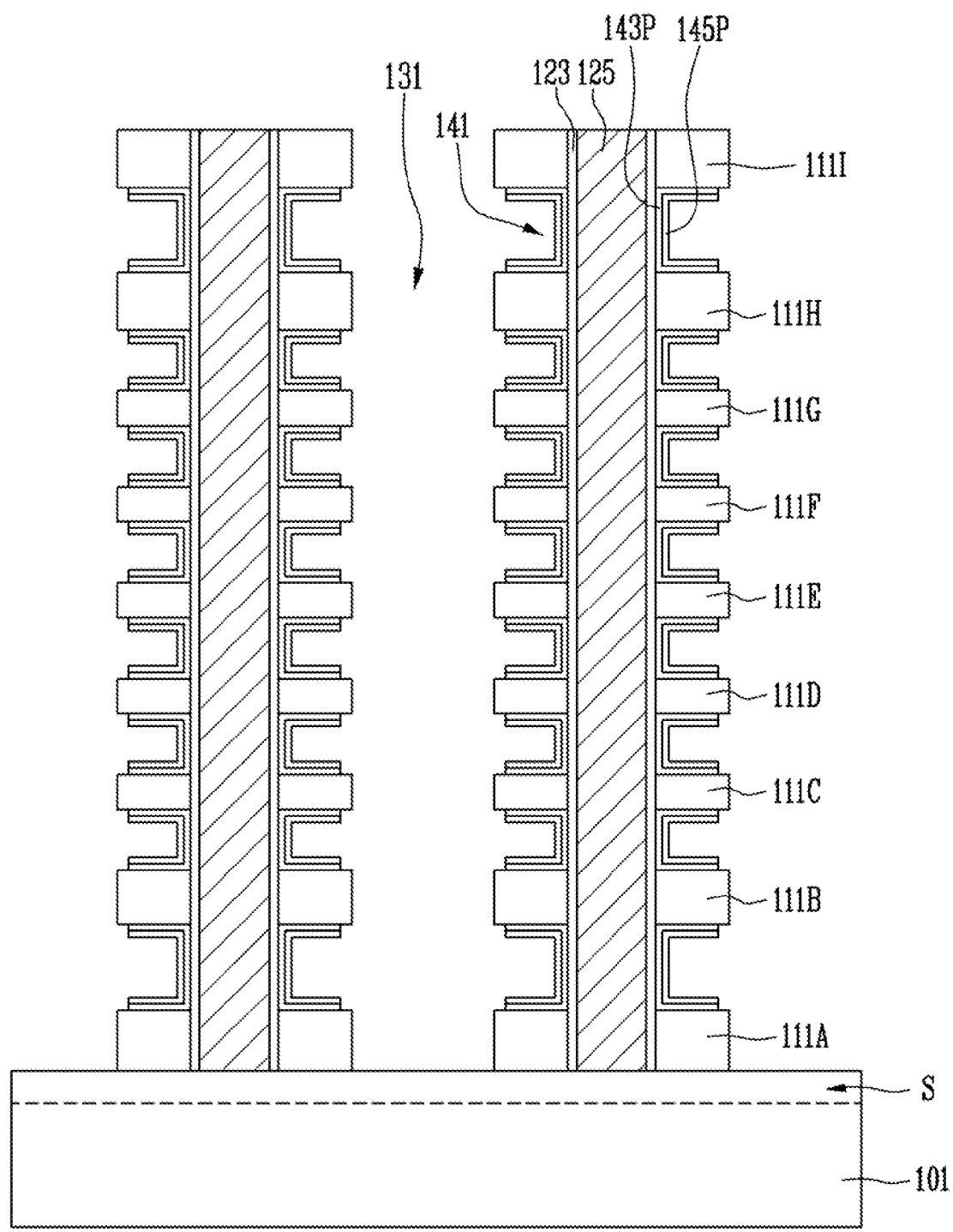

Referring to FIG. 3F, a seed pattern 145P and a barrier metal pattern 143P are formed in the respective recesses 141 by etching exposed regions of the seed film 145 and the barrier metal layer 143 by an etching process using the sacrificial patterns 151P as an etching barrier. The seed pattern 145P and the barrier metal pattern 143P are formed so as to be isolated for each recess 141. In this case, a width of each of the first material layers 111A to 111I may be greater than that of the seed pattern 145P and that of the barrier metal pattern 143P. In this case, a metal layer may be formed with a large volume in the recess 141 in subsequent processes.

The process of etching the seed film 145 and the barrier metal layer 143 may be performed by using, for example, a sulfuric acid ($H_2SO_4$) mixture, an ammonia ($NH_3$) mixture, or a hydrogen peroxide ($H_2O_2$) mixture.

Then, the seed pattern 145P, formed along the surfaces of the recesses 141, is exposed by removing the sacrificial patterns 151P.

Figure 3G:
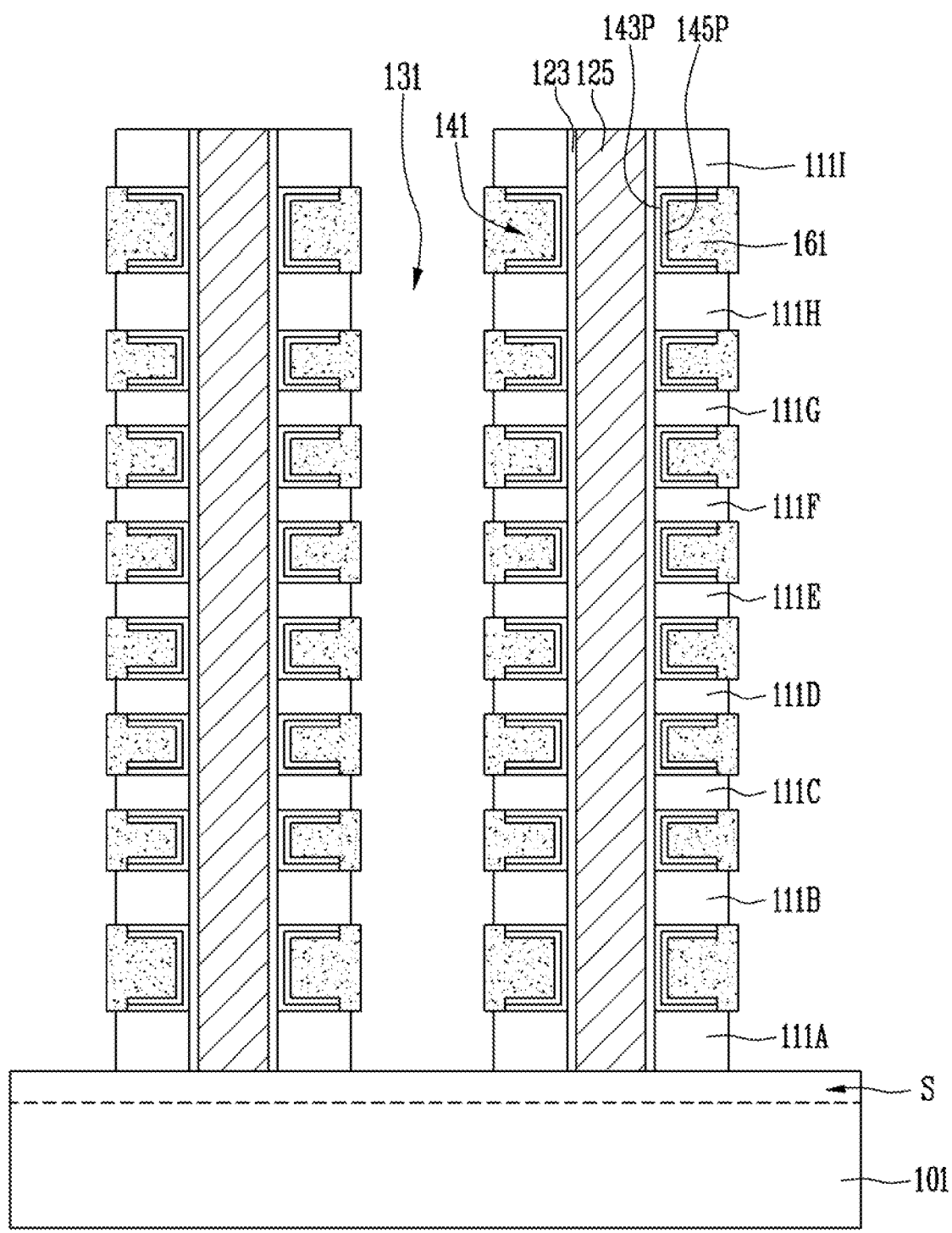

Referring to FIG. 3G, metal layers 161 are formed on the seed patterns 145P, exposed through the respective recesses 141, to fill the recesses 141. The metal layers 161 grow from the seed patterns 145P to fill the recesses 141. Accordingly, the metal layers 161 cover an entire exposed surface of each of the seed patterns 145P that is not in contact with the first material layers 111A to 111I, which define the recess 141.

A width of the metal layer 161 may be greater than that of each of the first material layers 111A to 111I. In this case, parts of the metal layers 161 may be formed on the sidewalls of the first material layers 111A to 111I due to excessive growth of the metal layers 161. However, even though the process of etching the metal layers 161 is not excessively performed, the parts of the metal layers 161 formed on the sidewalls of the first material layers 111A to 111I may be removed by the etching process. Even though the metal layers 161 are not excessively etched, the metal layers 161 may be formed in recesses 141 with the metal layers 161 separated from each other. Since the metal layer 161 is not excessively etched, it is possible to improve resistance of the metal layer 161 by providing a metal layer having a desired volume. Although not illustrated in the drawings, a sidewall of the metal layer 161 may be etched by a partial thickness. In this case, the width of the metal layer 161 may be less than the width of each of the first material layers 111A to 111I. Further, since it is possible to obtain a large interval between the adjacent metal layers 161 on the same layer, it is possible to reduce a bridge phenomenon between the adjacent metal layers 161 on the same layer.

The metal layer 161 may be formed by supplying a metal source gas after supplying a purge gas. Nitrogen, argon, or helium may be used as the purge gas. When the purge gas is supplied, non-reacted reducing gas is removed. Then, the metal source gas is supplied. For example, if a tungsten metal layer 161 is desired, then $WF_6$, $WCl_6$, or $W(CO_6)$ may be used as tungsten source gas. When the tungsten source gas is supplied, the seed pattern 145P is substituted with tungsten, and elements of the source gas except tungsten element are bound with elements of the seed pattern 145P to be in a gas state. For example, all the elements of the source gas, except the tungsten element, are bound with silicon element of the seed pattern 145P to be in a gas state. Accordingly, the metal layer 161 is selectively formed on the seed pattern 145P. The metal layer 161 may be etched by using, for example, an $H_2SO_4$ mixture, a $NH_3$ mixture, or a $H_2O_2$ mixture.

Hereinafter, an exemplary semiconductor memory device will be described in more detail. An exemplary semiconductor memory device includes the channel layer 125 protruding from the upper portion of the semiconductor substrate 101, the first material layers 111A to 111I surrounding the channel layer 125 and stacked while being spaced apart from each other with the recesses 141 interposed therebetween, the seed patterns 145P formed along the surfaces of the recesses 141, and the metal layers 161 formed so as to fill in the recesses 141, while covering the surfaces of each of the seed patterns 145P. An exemplary semiconductor memory device may further include the barrier metal pattern 143P formed between each of the recesses 141 and each of the seed patterns 145P. An exemplary semiconductor memory device may further include the memory layer 123 surrounding the sidewall of the channel layer 125.

The width of each of the first material layers 111A to 111I may be greater than the width of each of the seed patterns 145P and the barrier metal patterns 143P. Then, the width of the metal layer 161 may be greater or less than the width of each of the first material layers 111A to 111I. The metal layers 161 may be used as the select lines connected to the gates of the select transistors and the word lines connected to the gates of the memory cell transistors. For example, the metal layer 161, on at least one layer adjacent to the semiconductor substrate 101, may be used as the first select line, the metal layer 161, on at least one layer from the topmost layer, may be used as the second select line, and the metal layers 161 between the first and second select lines may be used as the word lines. A thickness of the first and second select lines may be formed to be the same as or different from that of the word lines.

The channel layer 125 may be connected to the source region S connected to the common source line.

The memory layer 123 formed between the first select line and the channel layer 125 and the memory layer 123 formed between the second select line and the channel layer 125 may be used as the gate insulation layer.

According to the aforementioned structure, the first select transistor is defined in a crossing portion of the first select line and the channel layer 125, and the memory cell transistors are defined in a crossing portion of the word lines and the channel layer 125. Then, the second select transistor is defined in a crossing portion of the second select line and the channel layer 125. Accordingly, the cell string is formed in a structure including the plurality of memory cell transistors stacked between the first and second select transistors and connected in series through the channel layer 125.

In an exemplary embodiment, the metal layers 161 may be formed in the recesses 141 with the metal layers separated from each other by selectively growing the metal layers 161 on the seed patterns 145P. Accordingly, it is not necessary to excessively etch the metal layer 161, thereby reducing process difficulty. Further, the metal layers 161 are selectively grown on the seed pattern 145P the entire surface of the seed pattern 145P is covered by the metal layer 161.

Figure 4:
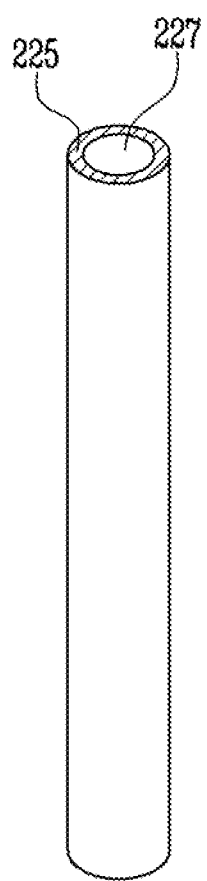
FIG. 4 is a diagram illustrating a channel layer of an exemplary semiconductor memory device.

FIG. 4 is a diagram illustrating a channel layer of an exemplary semiconductor memory device. As discussed below, an exemplary semiconductor memory device has the same configuration, with the exception of the channel layer, as discussed above with respect to FIGS. 2 and 3A-3G. Accordingly, only the channel layer of the exemplary semiconductor device will be described below.

A channel layer 225 may be formed in a tubular shape manner in a channel hole, so that the channel layer 225 surrounds the insulation layer 227.

FIG. 5 is a circuit diagram illustrating an exemplary semiconductor memory device.

Referring to FIG. 5, an exemplary semiconductor memory device may include a common source line CSL, a plurality of bit lines BL1 and BL2, and a plurality of cell strings CS1 and CS2 connected between the common source line CSL and the bit lines BL1 and BL2.

The common source line CLS is a conductive line disposed over the cell strings CS1 and CS2. The plurality of cell strings CS1 and CS2 are connected under the common source line.

Each of the bit lines BL1 and BL2 are conductive lines disposed over the plurality of cell strings CS1 and CS2, and are disposed on a different layer from that of the common source line CSL so as to be isolated from the common source line CSL. A series of cell strings arranged in an extension direction of each of the bit lines BL1 and BL2 is connected to each of the bit lines BL1 and BL2.

Each of the plurality of cell strings CS1 and CS2 include a first select transistor SST connected to the common source line CSL, a second select transistor DST connected to one of the plurality of bit lines BL1 and BL2, a pipe transistor Ptr formed under the first and second select transistors DST and SST, a first group of memory cell transistors MC1 to MCk stacked between the pipe transistor Ptr and the first select transistor SST, and a second group of memory cell transistors MCk+1 to MCn stacked between the pipe transistor Ptr and the second select transistor DST. The first select transistor SST, the first group of memory cell transistors MC1 to MCk, the pipe transistor Ptr, the second group of cell transistors MCk+1 to MCn, and the second select transistor DST, included in each of the plurality of cell strings CS1 and CS2, are connected in series through a channel layer.

A gate of the first select transistor SST is connected to a first select line SSL, and a gate of the second select transistor DST is connected to a second select line DSL. The gates of the first and second groups of the memory cell transistors MC1 to MCn are connected to word lines WL1 to WLn. A gate of the pipe transistor Ptr is connected to a pipe gate PG. The first select line SSL, the word lines WL1 to WLn, and the second select line DSL may extend in one direction to be formed in a line shape. Gates of the plurality of first select transistors SST, disposed in the same direction as an extension direction of the first select line SSL on the same layer as that of the first select line SSL, may be commonly connected to the first select line SSL. Gates of the plurality of second select transistors DST, disposed in the same direction as an extension direction of the second select line DSL on the same layer as that of the second select line DSL, may be commonly connected to the second select line DSL. Gates of a plurality of memory cells arranged in an extension direction of each of the word lines WL1 to WLn and disposed on the same layer as that of the word lines WL1 to WLn may be commonly connected to each of the word liens WL1 to WLn. The pipe gate PG may be commonly connected to the plurality of pipe transistors Ptr included in the memory block. The word lines WL1 to WLn and the first and second select lines SSL and DSL are formed of metal layers sequentially stacked over the pipe gate PG. The channel layer is surrounded by the metal layers, and a lower surface of the channel layer is surrounded by the pipe gate PG.

Hereinafter, the semiconductor memory device according to the third and fourth an exemplary semiconductor device, and a method of manufacturing the same, will be described in more detail.

FIGS. 6A to 6D are cross-sectional views for describing an exemplary semiconductor memory device and a method of manufacturing the same.

Figure 6A:
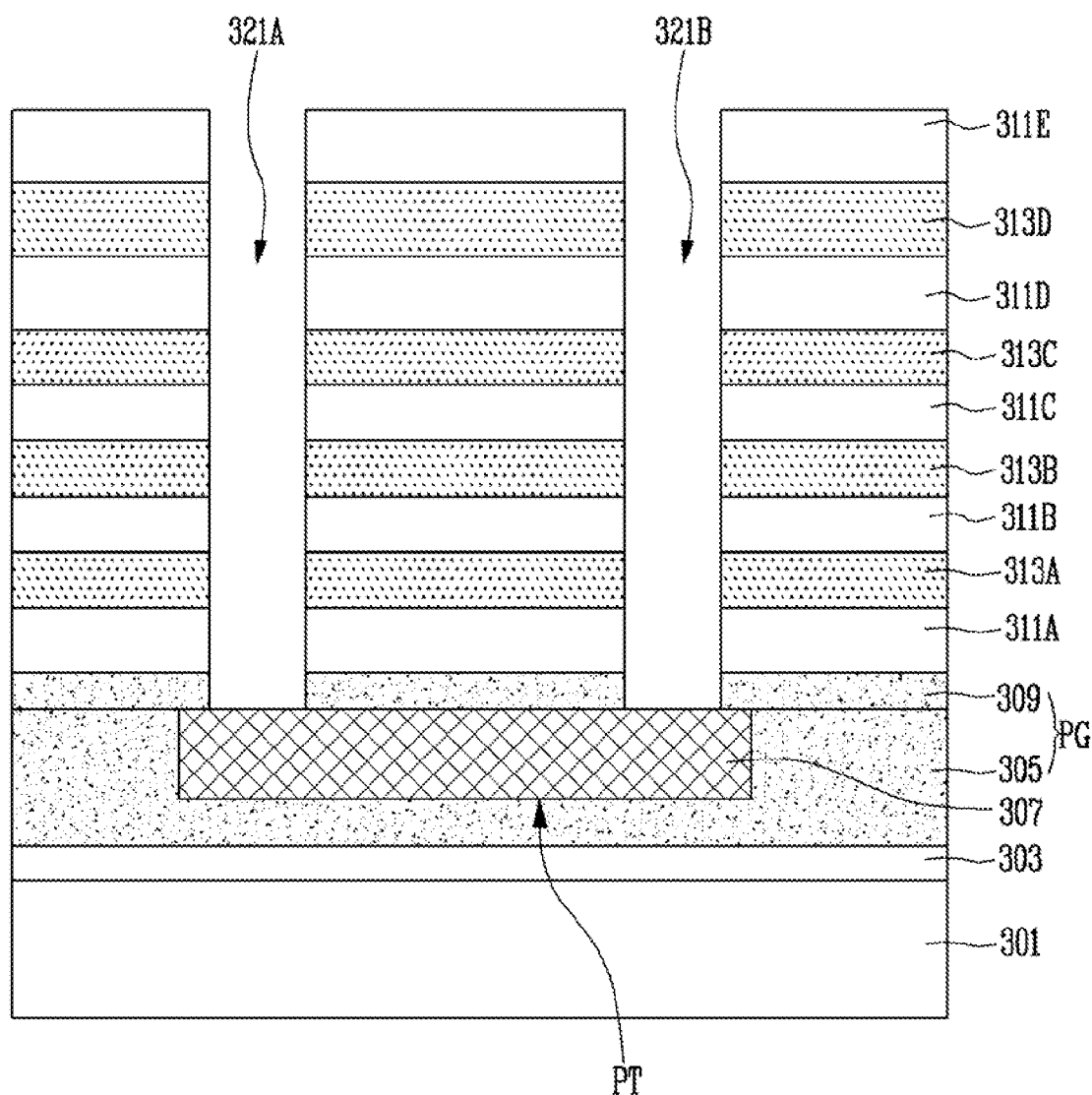
FIGS. 6A to 6D are cross-sectional views for describing an exemplary semiconductor memory device a method of manufacturing the same.

Referring to FIG. 6A, an insulation layer 303 is formed on a semiconductor substrate 301. Then, a first pipe conductive layer 305 is formed on the insulation layer 303, and a pipe trench PT is formed by etching a part of the first pipe conductive layer 305. Next, the pipe trench PT is filled with a sacrificial layer 307. A second pipe conductive layer 309 may be formed on the first pipe conductive layer 305 and the pipe sacrificial layer 307. Then, the pipe gate PG may be formed by etching the first and second pipe conductive layers 305 and 309.

Next, first material layers 311A to 311E and second material layers 313A to 313D are alternately stacked. The number of stacks of the first material layers 311A to 311IE and the second material layers 313A to 313D may be variously changed according to the number of memory cells and the number of select transistors desired to be stacked over the semiconductor substrate 101. The first material layers 311A to 311E may be formed in levels where interlayer insulation layers are formed. The second material layers 313A to 313D may be formed in levels where a first select line, word lines, or a second select line are formed. As discussed above with respect to FIG. 3A, the second material layers 313A to 313D are formed of a material layer having a greater etching selectivity than a material that forms the first material layers 311A to 311E.

Then, channels holes 321A and 321B, which pass through the first material layers 311A to 311E and the second material layers 313A to 313D, are formed by etching the first material layers 311A to 311E and the second material layers 313A to 313D using a mask process. When the second pipe conductive layer 309 is formed, the channel holes 321A and 321B further pass through the second pipe conductive layer 309. The channel holes 321A and 321B may be divided into a first channel hole 321A, through which one side of the pipe sacrificial layer 307 is exposed, and a second channel hole 321B, through which the other side of the pipe sacrificial layer 307 is exposed.

Figure 6B:
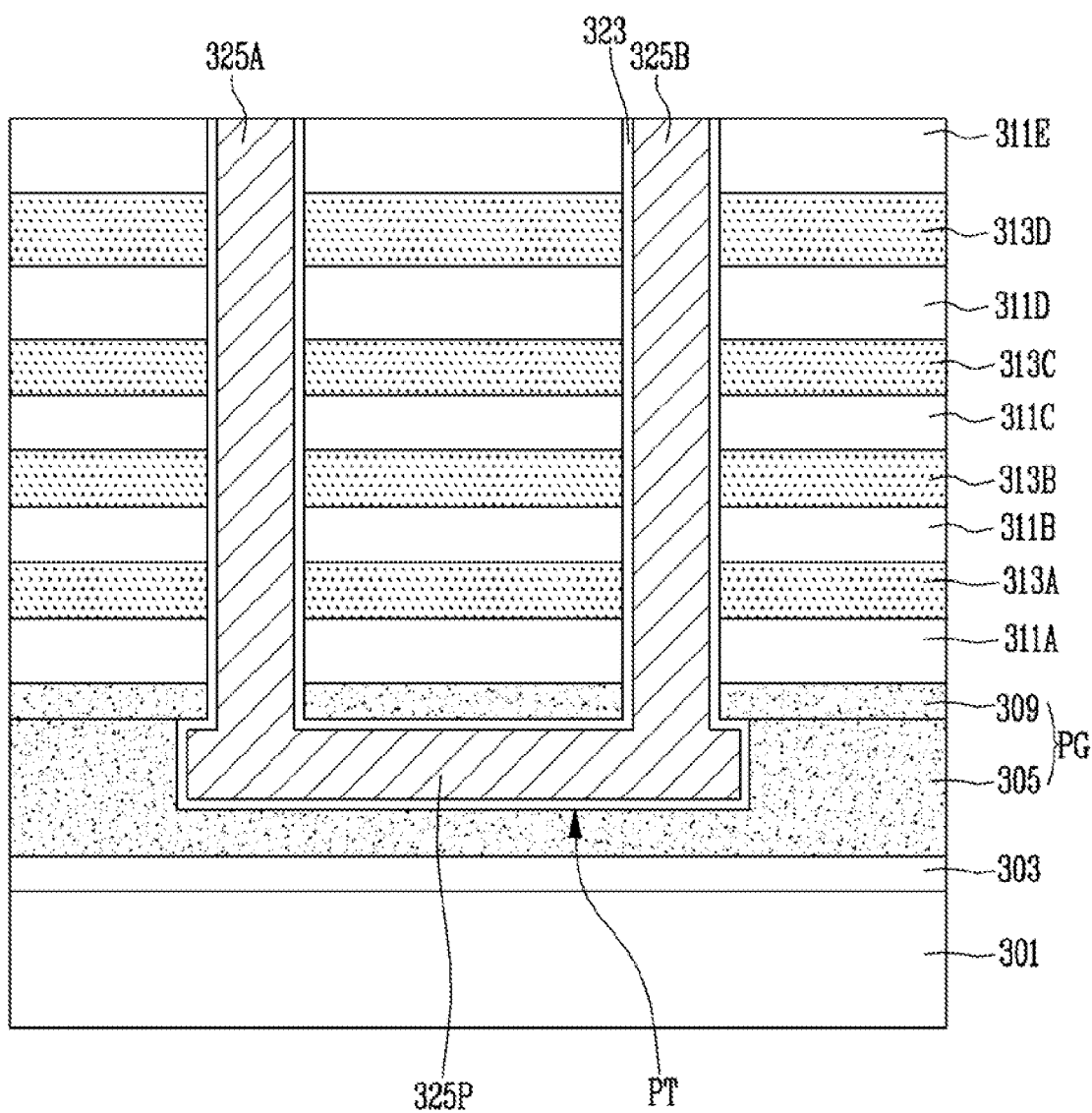

Referring to FIG. 6B, the pipe trench PT is exposed by removing the pipe sacrificial layer 307 exposed through the first and second channel holes 321A and 321B. In this case, if the pipe sacrificial layer 307 is formed of a material having an etching selectivity greater than an etching selectivity of the first material layers 311A to 311E and the second material layers 313A to 313D, then the pipe sacrificial layer 307 may be removed without performing a separate process of forming an etching barrier. Alternatively, if when the pipe sacrificial layer 307 is formed of a material having an etching selectivity that is less than an etching selectivity of the first material layers 311A to 311E and the second material layers 313A to 313D, then a spacer functions as an etching barrier may be formed on sidewalls that define the first and second channel holes 321A and 321B. The spacer is removed after removing the sacrificial layer 307.

After opening the pipe trench PT, a pipe channel layer 325P, disposed in the pipe trench PT, a first channel layer 325A, disposed in the first channel hole 321A, and a second channel layer 325B, disposed in the second channel hole 321B, are formed by filling the first and second channel holes 321A and 321B and the trench PT with a semiconductor layer. A memory layer 323 may be further formed along the surfaces of the pipe trench PT and the first and the second channel holes 321A and 321B. A configuration of the memory layer 323 is the same as the description of FIG. 3B.

Figure 6C:
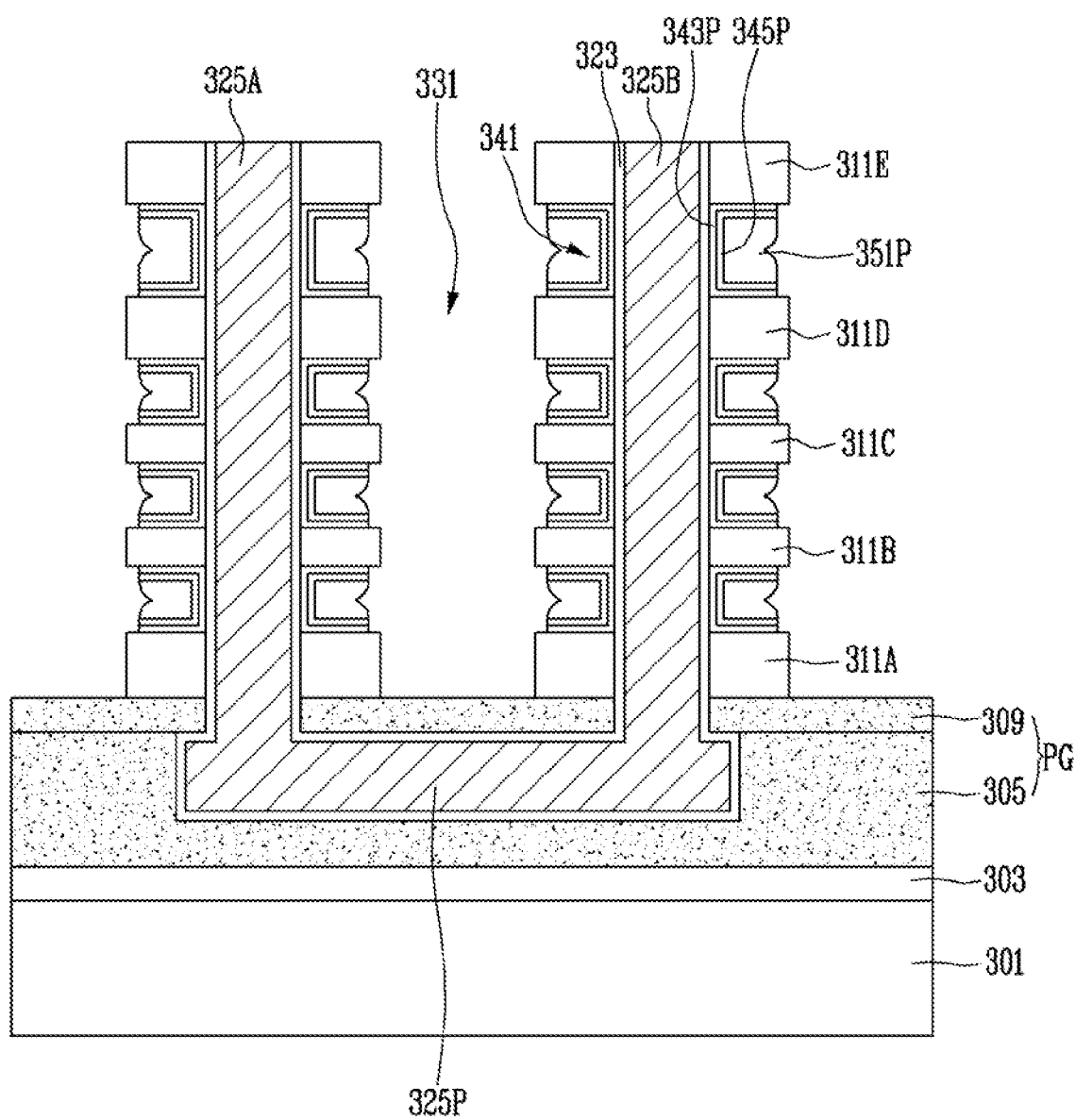

Referring to FIG. 6C, after forming the pipe channel layer 325P and the first and second channel layers 325A and 325B, a trench 331 is formed by etching the first material layers 311A to 311E and the second material layers 313A to 313D using a mask process. The trench 331 passes through the first material layers 311A to 311E and the second material layers 313A to 313D to expose the sidewalls of the second material layers 313A to 313D. The trench 331 may isolate the first material layers 311A to 311E and the second material layers 313A to 313D for each memory block or each line. The trench 331 may pass through the first material layers 311A to 311E and the second material layers 313A to 313D between the first and second channel layers 325A and 325B.

Next, recesses 341 are formed by performing an etching process, as described above with reference to FIG. 3C. Next, a seed film is formed, as described above with reference to FIG. 3D, or a barrier metal layer and a seed film are formed. Next, the recesses 341 are filled with a second sacrificial layer, as described above with reference to FIG. 3D. Next, a sacrificial pattern 351P is formed by performing an etching process, as described above with reference to FIG. 3E. Then, a barrier metal pattern 343P and a seed pattern 345P are formed by performing an etching process, as described above with reference to FIG. 3F. As described above, the barrier metal pattern 343P may not be formed.

Figure 6D:
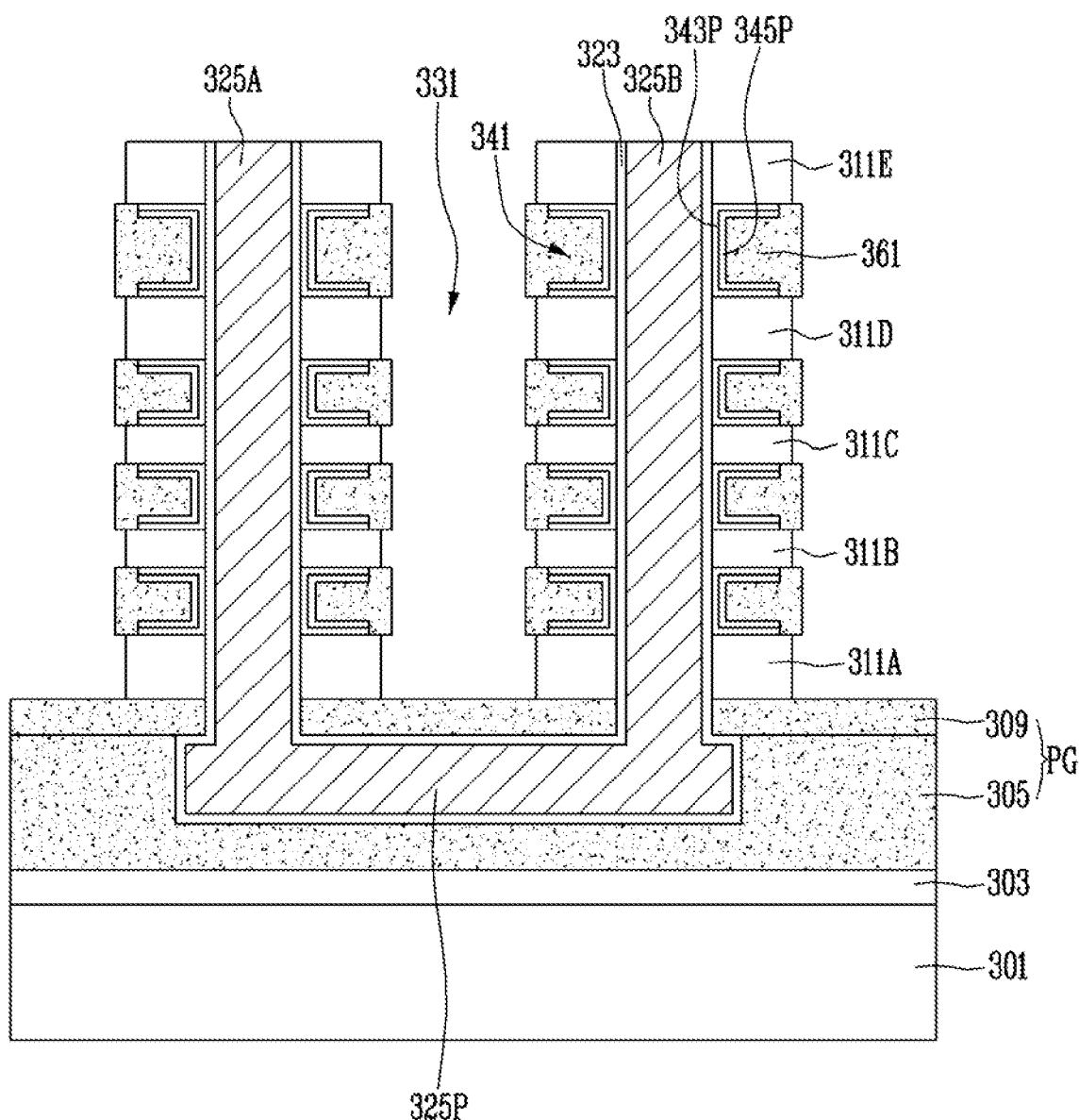

Referring to FIG. 6D, the seed patterns 345P formed along the surfaces of the recesses 341 are exposed by removing the sacrificial patterns 351P. Then, the recesses 341 is filled with metal layers 361 by growing the metal layers 361 from the seed patterns 345P, as described above with reference to FIG. 3G.

Hereinafter, referring to FIG. 6D, an exemplary semiconductor memory device will be described in more detail. An exemplary semiconductor memory device may include the insulation layer 303 formed on the semiconductor substrate 301, the pipe gate PG formed on the insulation layer 303, and the pipe channel layer 325P formed in the pipe gate PG. An exemplary semiconductor memory device may further includes the first channel layer 325A and the second channel layer 325B, both protruding from an upper portion of the pipe channel layer 325P, and the first material layers 311A to 311E for an interlayer insulation layer stacked so as to be spaced apart from each other with the recesses 341 interposed therebetween while surrounding each of the first and second channel layers 325A and 325B. In addition, an exemplary semiconductor memory device may further include the seed patterns 343P formed along the surfaces of the recesses 341, and the metal layers 361 formed so as to cover the entire surface of the seed patterns 343P and fill the recesses 341. An exemplary semiconductor memory device may further include the barrier metal pattern 343P formed between the recess 341 and the seed pattern 345P. An exemplary semiconductor memory device may further include the pipe channel layer 325P, and the memory layer 323 surrounding the first and second channel layers 325A and 325B.

Widths of the first material layers 311A to 311E may be greater than widths of the seed pattern 345P and the barrier metal pattern 343P. Further, a width of the metal layer 361 may be greater than the width of each of the first material layers 311A to 311E, or be less than the width of each of the first material layers 311A to 311E. The metal layers 361 may be used as the select lines connected to the gates of the select transistors and the word lines connected to the gates of the memory cell transistors. For example, a top most metal layer 161, of the metal layers 361 filled in the recesses 341, may be used as the first and second select lines. Here, the first select line may be formed so as to surround the first channel layer 325A, and the second select line may be formed so as to surround the second channel layer 325B. Further, metal layers 161, formed between the pipe gate PG and the first select line, and the pipe gate PG and the second select line, may be used as the word lines. A thickness of the first and second select lines may be formed to be the same as or different from that of the word lines.

The memory layer 323 formed between the first select line and the first channel layer 325A, the memory layer 323 formed between the second select line and the second channel layer 325B, and the memory layer 323 formed between the pipe gate PG and the pipe channel layer 325P may be used as the gate insulation layers.

According to the aforementioned structure, the first select transistor is defined in a crossing portion of the first select line and the channel layer 325A, and the second select transistor is defined in a crossing portion of the second select line and the second channel layer 325B. Further, the memory cell transistors are defined in a crossing portion of the word lines and the first channel layer 325A and a crossing portion of the word lines and the second channel layer 325B, and the pipe transistor is defined in a crossing portion of the pipe gate PG and the pipe channel layer 325P. Accordingly, the cell string is formed in a structure including the plurality of memory cell transistors connected in series between the first and second select transistors through the channel layers 325A, 325P, and 325B.

In an exemplary embodiment of the present invention, the metal layers 361 may be formed in the recesses 341 as described above with respect to FIGS. 3A to 3G, thereby reducing processing difficulty.

FIG. 7 is a diagram illustrating a channel layer of an exemplary semiconductor memory device. As discussed below, an exemplary semiconductor memory device has the same configuration, with the exception of the channel layer, as discussed above with respect to FIGS. 6A-6D. Accordingly, only the channel layer of the exemplary semiconductor device will be described below.

A pipe channel layer 425P, having an opening defined therein, may be formed along surfaces of a pipe trench. A first channel layer 425A and a second channel layer 425B, each having openings defined therein, may be formed on surfaces defining the first channel hole and the second channel holes. In this case, an insulation layer 427 may be fill the openings defined in the pipe channel layer 425P, the first channel layer 425A, and the second channel layer 425B. Accordingly, the pipe channel layer 425P surrounds the insulation layer 427, and the first channel layer 425A and the second channel layer 425B surround the insulation layer 427.

Figure 8:
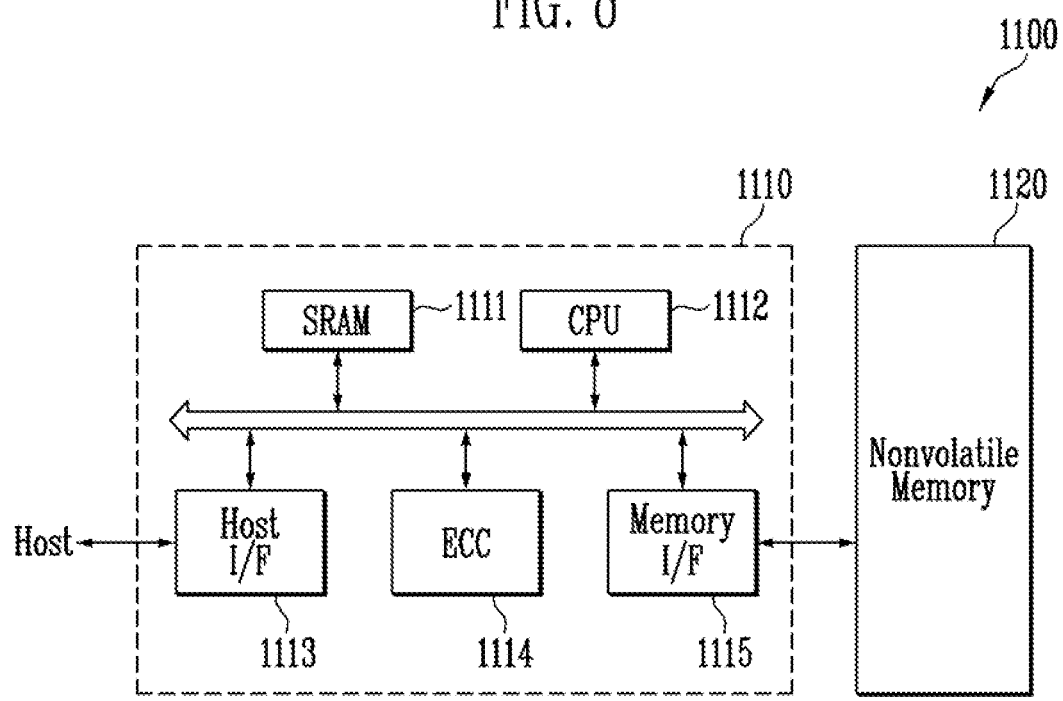
FIG. 8 is a configuration diagram illustrating an exemplary memory system.

FIG. 8 is a configuration diagram illustrating an exemplary memory system according.

Referring to FIG. 8, a memory system 1100 according to an embodiment of the present invention may include a non-volatile memory device 1120 and a memory controller 1110.

The non-volatile memory device 1120 includes the semiconductor memory device described with reference to the embodiments described with reference to FIGS. 2 to 7. Further, the non-volatile memory device 1120 may be a multi-chip package including a plurality of flash memory chips.

The memory controller 1110 is configured to as to control the non-volatile memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol of a host accessing the memory system 1110. Further, the ECC 1114 detects and corrects an error included in data read from the non-volatile memory device 1120, and the memory interface 1115 performs interfacing with the non-volatile memory device 1120. In addition, the memory controller 1110 may further include a ROM, or the like, for storing code data for interfacing with the host.

The memory system 1100 including the aforementioned configuration may be a memory card or a Solid State Disk (SSD) in which the non-volatile memory device 1120 is combined with the controller 1110. For example, when the memory system 1110 is the SSD, the memory controller 1110 may communicate with an external device (for example, a host) through one among various interface protocols, such as USB, MMC, PCI-E, SATA, PATA, SCSI, ESDI, or IDE.

Figure 9:
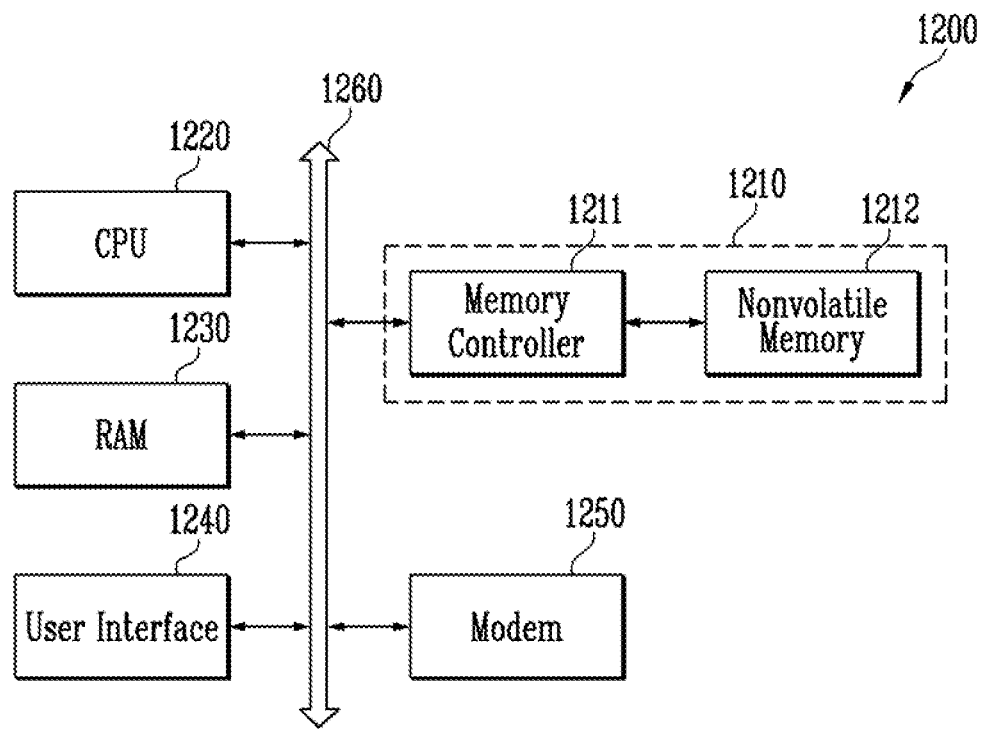
FIG. 9 is a diagram illustrating an exemplary computing system.

FIG. 9 is a diagram illustrating an exemplary computing system that may include a CPU 1220 electrically connected to a system bus 1260, a RAM 1230, a user interface 1240, a modem 1250, and a memory system 1210. Further, when the computing system 1200 is a mobile device, a battery for supplying an operation voltage to the computing system 1200 may be further included, and an application chip set, a camera image processor (CIS), a mobile D-RAM, and the like may be further included.

The memory system 1210 may be configured with a non-volatile memory 1212 and a memory controller 1211 as previous described with reference to FIG. 8.

According to exemplary embodiments, it is possible to manufacture the semiconductor memory device including the insulation layers and the conductive layers, which are stacked, alternately with each other by filling the recesses between the interlayer insulation layers with the metal layers.

According to exemplary embodiments, it is possible to form the metal layers in the recesses with the metal layers separated from each other by growing the metal layers from the surface of the seed patterns formed in the recesses when the recesses are filled with the metal layers. Accordingly, the exemplary embodiments may improve a level of process difficulty.

As described above, exemplary embodiments have been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A method of manufacturing a semiconductor memory device, the method comprising:
   alternately stacking interlayer insulation layers and sacrificial layers over a semiconductor substrate;
   forming channel holes vertically passing through the interlayer insulation layers and the sacrificial layers;
   forming memory layers along surfaces of the channel holes;
   forming channel layers in the channel holes including the memory layers;
   forming a trench between the channel holes by etching a portion of the interlayer insulation layers and the sacrificial layers after forming the channel layers;
   forming recesses between the interlayer insulation layers by removing the sacrificial layers after forming the trench;
   forming seed films over surfaces of the recesses and on surfaces of the interlayer insulation layers;
   forming sacrificial patterns in the recesses after forming the seed films;
   forming seed patterns in the recesses by etching the seed films exposed between the sacrificial patterns using the sacrificial patterns as an etching barrier; and
   growing metal layers from the seed patterns in the recesses.

2. The method of claim 1, further comprising:
   forming barrier metal layers along surfaces of the recesses and along surfaces of the interlayer insulation layers before the forming of the seed films.

3. The method of claim 1, further comprising:
   forming barrier metal patterns under the seed patterns by etching the barrier metal layers by using the sacrificial patterns as an etching barrier.

4. The method of claim 1, wherein a width of each of the sacrificial patterns is less than a width of each of the interlayer insulation layers.

5. The method of claim 1, wherein the metal layers are to cover entire surfaces of the seed patterns.

6. The method of claim 1, wherein a width of each of the metal layers is greater or less than a width of each of the interlayer insulation layers.

7. The method of claim 1, wherein the forming the seed films comprises:
   forming the seed films using a reducing gas.

8. The method of claim 7, wherein the growing the metal layers comprises:
   removing the reducing gas using a purge gas; and
   substituting the seed patterns with the metal layers via a metal source gas.

* * * * *